US008979393B2

(12) United States Patent
Kihara

(10) Patent No.: US 8,979,393 B2
(45) Date of Patent: Mar. 17, 2015

(54) OPTICAL MODULE WITH FIBER UNIT AUTOMATICALLY ALIGNED WITH HOUSING

(75) Inventor: Toshiaki Kihara, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/509,708

(22) PCT Filed: Sep. 22, 2011

(86) PCT No.: PCT/JP2011/072497
§ 371 (c)(1),
(2), (4) Date: May 14, 2012

(87) PCT Pub. No.: WO2012/039515
PCT Pub. Date: Mar. 29, 2012

(65) Prior Publication Data
US 2012/0321258 A1 Dec. 20, 2012

(30) Foreign Application Priority Data

Sep. 22, 2010 (JP) ................. 2010-211631

(51) Int. Cl.
*G02B 6/42* (2006.01)
*H01S 5/022* (2006.01)

(52) U.S. Cl.
CPC ........... *G02B 6/4228* (2013.01); *G02B 6/42* (2013.01); *G02B 6/4214* (2013.01); *G02B 6/4246* (2013.01); *G02B 6/4263* (2013.01); *H01S 5/02284* (2013.01)
USPC .......................................... 385/93

(58) Field of Classification Search
CPC ........... G02B 6/42; G02B 6/4246; G02B 6/36
USPC .......................................... 385/93
See application file for complete search history.

(56) References Cited

U.S. PATENT DOCUMENTS

| 5,066,089 | A |   | 11/1991 | Greil et al. |   |
|---|---|---|---|---|---|
| 5,408,559 | A | * | 4/1995 | Takahashi et al. | 385/89 |
| 6,142,680 | A | * | 11/2000 | Kikuchi et al. | 385/93 |
| 6,493,121 | B1 | * | 12/2002 | Althaus | 398/135 |

(Continued)

FOREIGN PATENT DOCUMENTS

| JP | 02-281219 A | 11/1990 |
|---|---|---|
| JP | 03-011310 A | 1/1991 |

(Continued)

OTHER PUBLICATIONS

Office Action in Chinese Patent Application No. 201180004694.0, dated Nov. 25, 2013.

(Continued)

*Primary Examiner* — Charlie Y Peng
(74) *Attorney, Agent, or Firm* — Venable LLP; Michael A. Sartori; Tamatane J. Aga

(57) ABSTRACT

An optical module with some OSAs and a fiber unit is disclosed. The fiber unit includes a stub and a flange. A portion of the stub extrudes from the flange; while, the housing of the module that assembles the OSAs includes a pocket with a diameter substantially equal to or slightly greater than a diameter of the stub. Setting the portion of the stub into the pocket, the fiber unit may be automatically aligned with the OSAs through the housing.

10 Claims, 6 Drawing Sheets

(56) References Cited

U.S. PATENT DOCUMENTS

| | | | |
|---|---|---|---|
| 7,364,374 B2* | 4/2008 | Liu | 385/93 |
| 7,369,776 B2* | 5/2008 | Masahiko | 398/138 |
| 7,374,346 B2* | 5/2008 | Tanaka et al. | 385/88 |
| 7,556,439 B2* | 7/2009 | Nakanishi et al. | 385/92 |
| 8,265,486 B2* | 9/2012 | Lim et al. | 398/135 |
| 2001/0048794 A1* | 12/2001 | Nakaya et al. | 385/93 |
| 2005/0018981 A1* | 1/2005 | Modavis et al. | 385/93 |
| 2005/0036744 A1* | 2/2005 | Caveney et al. | 385/87 |
| 2007/0071444 A1* | 3/2007 | Okada et al. | 398/135 |
| 2007/0104426 A1* | 5/2007 | Yun et al. | 385/88 |

FOREIGN PATENT DOCUMENTS

| | | |
|---|---|---|
| JP | 3-144602 A | 6/1991 |
| JP | 09-211258 A | 8/1997 |
| JP | 2003-524789 A | 8/2003 |
| JP | 2007-279614 A | 10/2007 |

OTHER PUBLICATIONS

Notification of Reasons of Rejection issued in Japanese Patent Application No. 2010-211631 dated Jul. 22, 2014.

* cited by examiner

OPTICAL MODULE WITH FIBER UNIT AUTOMATICALLY ALIGNED WITH HOUSING

TECHNICAL FIELD

The present invention relates to an optical module, in particular, the invention relates to a bi-directional optical module whose fiber unit is automatically aligned with the housing of the module.

BACKGROUND ART

One type of optical system has been well known where an external fiber is coupled with an optically active device in the module by a focused optical system not a collimated optical system. Patent Literature 1 has disclosed the collimated optical system in an optical module; meanwhile, Patent Literature 2 has disclosed the focused optical system. The latter optical system has made it possible to align a plurality of optical subassemblies independently with an external optical fiber, which may simplify the aligning process of the module.

CITATION LIST

Patent Literature

[PTL 1]
JP-H03-144602A
[PTL 2]
JP-H09-211258A

SUMMARY OF INVENTION

Technical Problem

However, the optical alignment of the external fiber along the optical axis thereof has been left even the module implements with the focused optical arrangement.

Solution to Problem

An optical module according to the present invention comprises a fiber unit, a housing, and at least two optical subassemblies each including a unit lens and an optical active semiconductor device. The fiber unit includes a stub with a coupling fiber in a center portion thereof. The housing includes a bore and a pocket. The bore installs a first lens, while, the pocket receives a portion of the stub with the coupling fiber protruding from an end of the fiber unit. A feature of the present invention is that a diameter of the stub is substantially equal to or slightly less than a diameter of the pocket of the housing such that the fiber unit may be automatically aligned with the housing.

Advantageous Effects of Invention

In the optical module of the present invention, the external fiber can be aligned along the optical axis.

BRIEF DESCRIPTION OF DRAWINGS

Non-limiting and non-exhaustive embodiments of the present invention will be described with reference to the following figures, wherein like reference numerals refer to like parts throughout the various figures unless otherwise specified.

FIG. 1A is an outer appearance of the optical module according to an embodiment of the invention, while, FIG. 1B is a cross section thereof taken along the optical axis of the external fiber;

DESCRIPTION OF EMBODIMENTS

Figure 1:
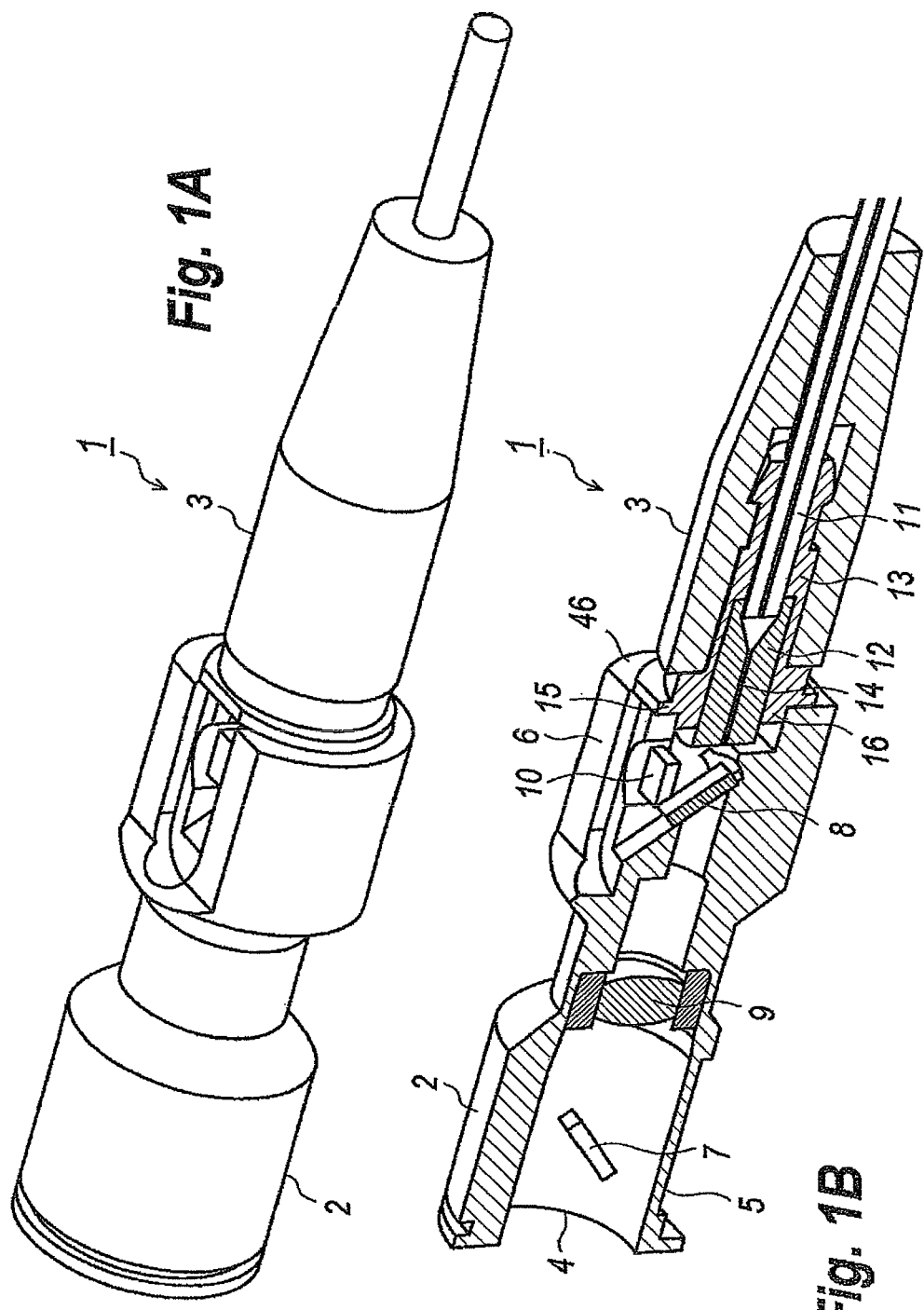

Next, some preferred embodiments according to the present invention will be described. FIG. 1 schematically shows an optical module according to the present embodiment, where FIG. 1A is an outer appearance of the optical module, while, FIG. 1B is a cross section of the optical module taken along the optical axis thereof. As shown in FIG. 1A, the optical module 1 includes a housing optically coupled with a fiber unit 3. The housing 2 includes a first end 4 to which a first transmitter optical subassembly (hereafter denoted as TOSA) is attached, a second end 5 to which a second TOSA is attached, and a third end to which a receiver optical subassembly (hereafter denoted as ROSA) is attached. The TOSA and the ROSA are collectively called as an optical subassembly (OSA). The first TOSA transmits a first optical signal to an optical fiber 11, the second TOSA transmits a second optical signal also to the optical fiber 11, and the ROSA receives a third optical signal from the optical fiber 11.

The housing installs a first wavelength division multiplexing filter (hereafter denoted as WDM filter) 7, a second WDM filter 8, a first lens 9, and a wavelength cut filter 10. The cut filter 10 may cut the first optical signal with the first wavelength coming from the first TOSA and the second optical signal with the second wavelength coming from the second TOSA, respectively. Thus, the cut filter may protect the ROSA attached to the third end 6 from receiving the stray light originated to the first and second optical signals.

The fiber unit 3 includes a ferrule 11, a stub 12, and a sleeve 13. The sleeve 13 sets the stub 12 therein in a side of the housing 2. The stub 12 includes a coupling fiber 14 in a center thereof. The fiber unit 3 further includes a flange 15 by which the fiber unit 3 may be attached to the fourth end 46 of the housing 2, where the fourth end 46 includes an aperture 16 into which the end of the stub 12 is inserted to position the stub 12.

Figure 2:
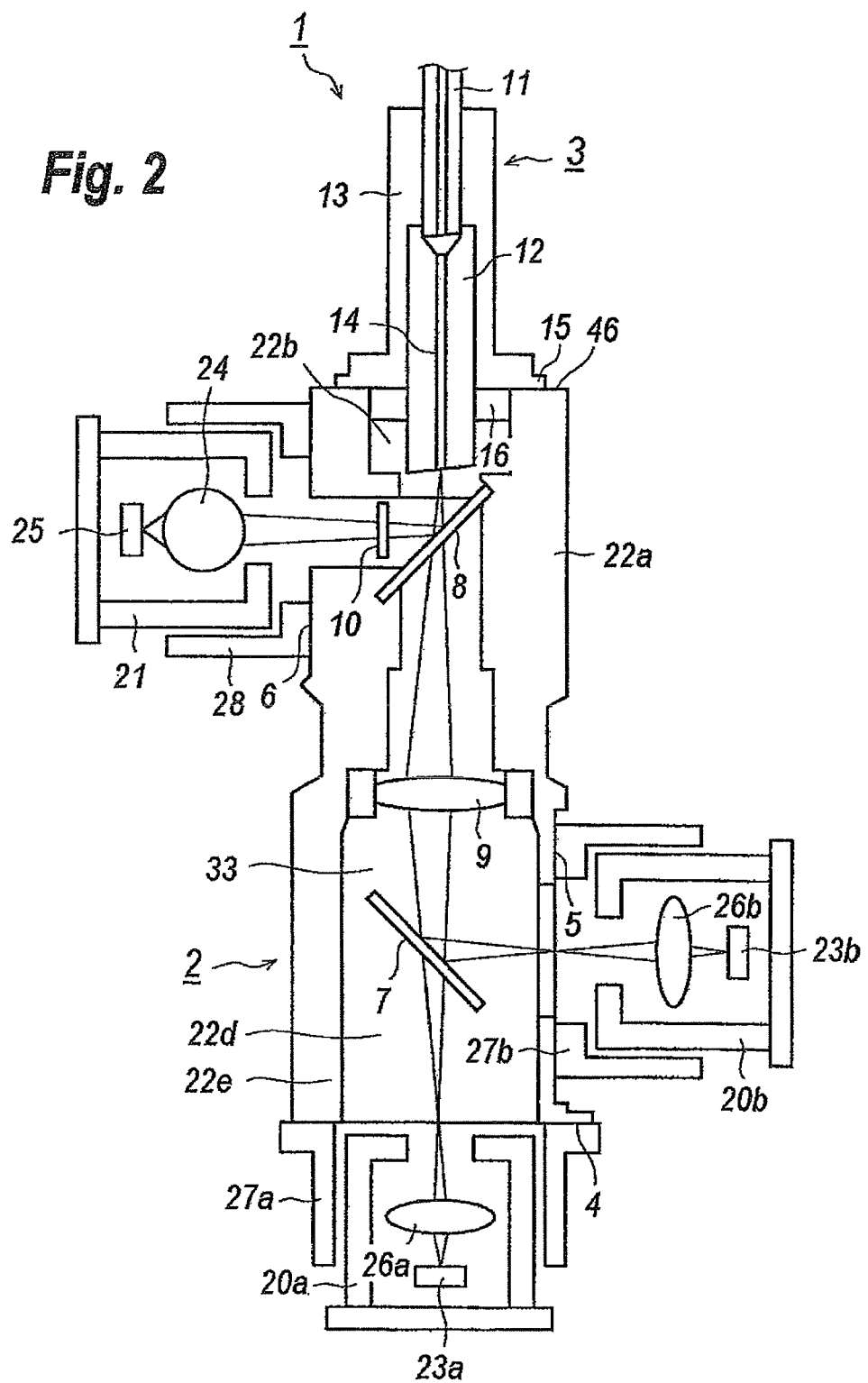
FIG. 2 schematically illustrates the focused optical system implemented with the optical module shown in FIGS. 1A and 1B.

FIG. 2 schematically shows the fiber unit 3, the first TOSA 20a, the second TOSA 20b, the ROSA 21 each assembled with the housing 2. The optical module 1 of the present embodiment fixes the sleeve 13, by which the stub 12 is fixed, on the fourth end 46 of the front housing 22a of the housing 2, while, the first TOSA 20a to the first end 4 of the rear housing 22e opposite to the fourth end 46. The second end 5, which is the side of the rear housing 22e, fixes the second TOSA 20b, and the third end 6, which is the side of the front housing 22a diagonal to the second end 5 in the rear housing 22e, fixes the ROSA 21 thereto.

The rear housing 22e of the housing 2 installs the first WDM filter 7, while, the front housing 22a installs the second WDM filter 8 and the cut filter 10. The lens 9 is set in an interface between the front and rear housings, 22a and 22e. The first lens 9 may form a beam waist at an end of the coupling fiber 14 set within the stub 12, while the lens 9 may also form another beam waist at a virtual surface extending from the first end 4. The first lens 9 may have the image magnification of one and set in a substantial center of the bore 22d of the housing 2.

The optical path from the coupling fiber 14 is branched by the second WDM filter 8, that is, one of the paths heads the first lens 9, while, the other branch heads the ROSA 21 bent substantially in right angle by the second WDM filter 8. The cut filter 10 is set in a midway of the branched path between the second WDM filter 8 and the ROSA 21 to cut light coming from the first and second TOSAs, 20a and 20b.

The ROSA 21 includes a unit lens 24 therein. This unit lens may have the type of the spherical lens that forms a beam waist on the light receiving surface of the PD 25 and another beam waist on the end of the coupling fiber 14 when the ROSA 21 is fixed to the third end 6. The optical path passing through the first lens 9 may be divided into two paths, one of which heads the first TOSA 20a passing through the first WDM filter 7, while, the other heads to second TOSA 20b bent substantially in right angle by the first WDM filter 7. The divided and bent beam heading the second TOSA 20b may form the beam waist at a virtual surface extending from the second end 5.

The first TOSA 20a installs the unit lens 26a therein. This lens 26a may form one of beam waists on a surface of the LD 23a, while, the other beam waist on the virtual surface extending from the first end 4 as the first TOSA 20a is fixed thereto. Thus, the unit lens 26a may optically couple with the first lens 9 by setting the substantially common beam waist on the virtual surface of the first end 4.

The second TOSA 20b includes another unit lens 26b. This unit lens 26b may form one of beam waists on the surface of the second LD 23b, while, the other beam waist at a virtual surface extending from the second end 5 as the second TOSA 20b is fixed thereto. The unit lens 26b may optical couple with the first lens 9 by setting the substantial common beam waist on the virtual surface of the second end 5.

The end of the coupling fiber 14 facing the housing 22 may be polished concurrently with the ferrule 12 so as to make an angle of about 6 degrees with respect to a surface perpendicular to the optical axis of the coupling fiber 14. The inclined angle of the end of the coupling fiber 14 and the ferrule 12 may prevent light coming from the TOSAs, 20a and 20b, from being reflected thereat and going back to the TOSAs, 20a and 20b. The reflected and returned light may cause an optical noise for the signals from the TOSAs, 20a and 20b. The coupling fiber 14 may optical align in the optical axis thereof with the axis of the unit lens 26a. Meanwhile, the first lens 9 in the axis thereof may be offset from the axis of the coupling fiber 14 and that of the unit lens 26a such that the light coming from the TOSAs, 20a and 20b, may enter the inclined end of the coupling fiber 14 by a preset angle. According to the optical arrangement thus described, the light entering the coupling fiber 14 may propagate in the coupling fiber 14 substantially in parallel to the optical axis thereof.

Figure 3A:
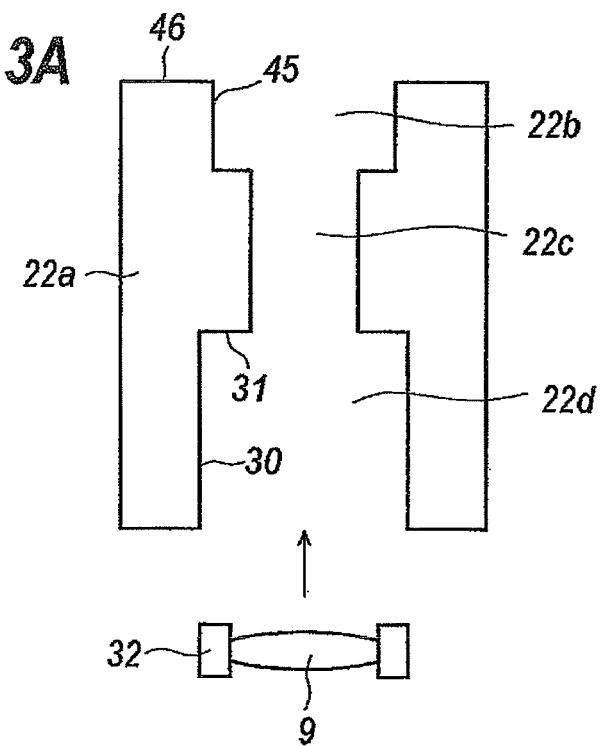
FIGS. 3A and 3B show processes to assemble the first lens with the housing of the module.
Figure 3B:
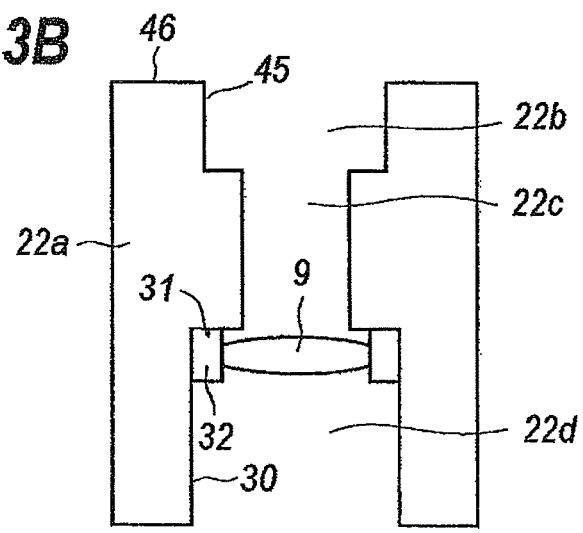

The first lens 9 may be positioned by the bore 22d of the rear housing 22e. FIGS. 3A and 3B illustrate a process to set the first lens 9 within the bore 22d. The housing 2 of the present embodiment includes the front and rear housings, 22a and 22e, each providing a pocket 22b and the bore 22d. Another bore 22c connects the bore 22d to the pocket 22b. Referring to FIG. 2, the pocket 22b receives a portion of the fiber unit 3, the bore 22d receives the first lens 9 and the first WDM filter 7, and the other bore 22c sets the second WDM filter 8 therein.

The bore 22d includes an inner surface 30 and a bottom 31. The first lens 9 with a support 32 that supports the periphery of the first lens 9 is inserted into the bore 22d and fixed thereto such that the outer surface of the support 32 comes in contact with the inner surface 30 while the one end of the support 32 abuts against the bottom 31. The fixing of the first lens 9 with the support 32 may be carried out by the YAG laser welding that irradiates YAG laser beam from the outside of the rear housing 22e, or by the press-fitting of the lens 9 with the support 32 into the bore 22d. The former process may thin a portion of the front housing 22a to facilitate the welding; while, the latter process may set the diameter of the bore 22d slightly smaller than the diameter of the support 32.

The diameter of the inner surface 30, that of the support 32 and the tolerance thereof are set such that a gap between the inner surface 30 and the support 32 is substantially zero or small enough. For instance, when the diameter of the inner surface 30 is 3.015 mm with a tolerance of ±0.01 mm, the outer diameter of the support 32 is set to be 2.999 mm with a tolerance of ±0.006 mm. The gap between the members becomes 0.016 mm at the maximum and 0.000 mm at the minimum.

Figure 4A:
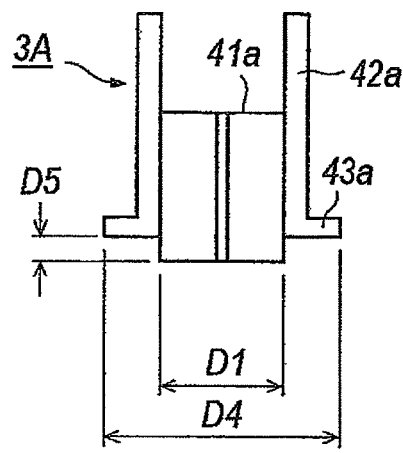
FIGS. 4A to 4C schematically illustrate an arrangement of the fiber unit of the SC connector, the LC connector, and the pig-tail, respectively.
Figure 4B:
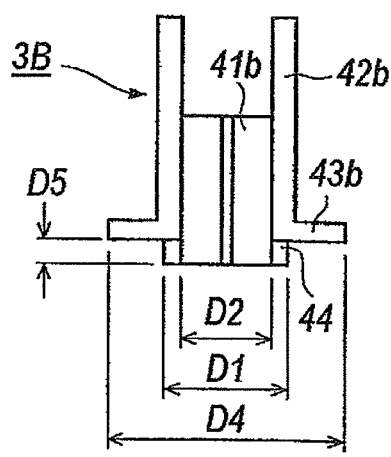
Figure 4C:
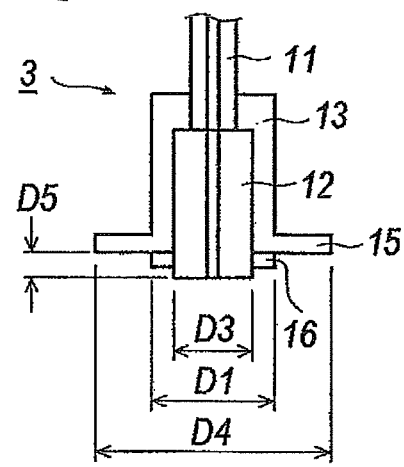
Figure 4D:
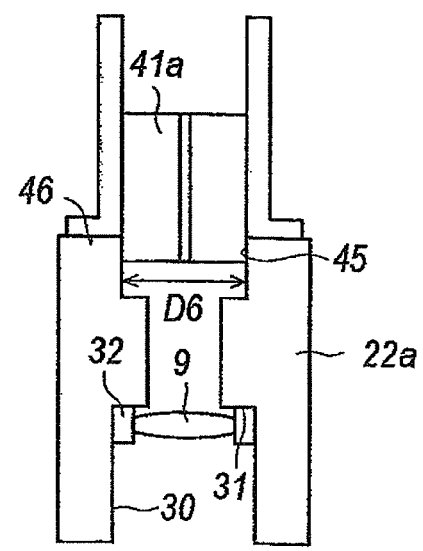
FIG. 4D illustrates the fiber unit with the arrangement of the SC-connector fixed to the housing of the module.

Although FIGS. 1 and 2 show the optical module with the fiber unit 3 of, what is called, the pig-tail arrangement, that is, the optical module 1 provides the optical fiber permanently fixed thereto; the optical module 1 may be implemented with a detachable optical connector such as an SC connector, an LC connector and so on. FIGS. 4A to 4D show the front housing 22a attaches various types of the optical connectors thereto whose dimensions are different from others. FIG. 4A corresponds to the arrangement of the SC unit 3A that mates with the SC connector, FIG. 4B shows the LC unit 3B attachable with the LC connector, FIG. 4C is the arrangement of the pig-tail unit 3, and FIG. 4D shows an arrangement where the SC unit 3A is attached to the front housing 22a.

The outer diameter D1 of the stub 41a of the SC unit 3A, the diameter D2 of the stub 41b of the LC unit 3B, the diameter D3 of stub 12 of the pig-tail unit 3 are different from others. For instance, the code of the SC connector defines the diameter D1 is 2.499 mm, that of the LC connector defines the diameter D2 is 1.25 mm, and the pig-tail unit 3 of the present embodiment sets the diameter of the stub is 1.4 mm.

Because the largest diameter D1 is set in the code of the SC connector, the inner diameter D6 of the pocket 22b formed in the front housing 22a may be designed based on this largest diameter of the stub 41a, that is, the inner diameter D6 of the pocket 22b is set such that the gap between the stub 41b and the inner surface 45 of the pocket 22b is substantially zero or small enough.

The sleeve 42a supporting the stub 41a provides the flange 43a by which the SC unit 3A is attached to the fourth end 46 of the housing 2. The stub 41a protrudes from the end of the flange 43a by a length D5. As illustrated in FIG. 4D, the protruding portion of the stub 41a mates with a pocket 22b of the front housing 22a. Specifically, setting the diameter of the pocket 22b substantially equal to the outer diameter D6 of the stub 41a, the optical alignment of the sleeve 42a may be automatically carried out in a plane perpendicular to the optical axis. In an example, setting the diameter D1 of the stub 41a to be 2.499 mm with a tolerance of ±0.005 mm and the diameter D6 of the bore 45 to be 2.519 mm with a tolerance of ±0.01 mm; two members, 41a and 22a, may form a gap therebetween of 0.0165 mm at the maximum and 0.0025 mm at the minimum.

In the case of the LC unit 3B, the sleeve 42b provides the flange 43b in the end thereof facing the front housing 22a. The stub 41b is set so as to protrude from the end of the flange 43b by a length D5. However, the outer diameter D2 of the stub 41b of the LC unit 3B is less than the inner diameter D6 of the bore 45, because the pocket 22b is designed for the SC unit 3A, the sleeve 42b of the LC unit 3B may widely slide on the fourth end 46 of the front housing 22a without any additional members. The LC unit 3B according to the present embodiment may provide a doughnut cylinder 44 in the end surface of the flange 43b so as to surround the protruding stub 41b. The height of the doughnut cylinder 44 is substantially equal to the protruding length of the stub 41b. Moreover, the radial width of the doughnut cylinder 44 is set such that the sum of the radial width of the doughnut cylinder 44 and the diameter of the stub 41b becomes substantially equal to or slightly less than the inner diameter D6 of the bore 45. In such an arrangement, the doughnut cylinder 44 with the protruding stub 41b may be fit within the pocket 22b, which may automatically align the sleeve 42b of the LC unit 3B optically with the front housing 22a of the housing 2.

In the pig-tail unit 3, as shown in FIG. 4C, the stub 12 also protrudes from the end surface of the flange 15 by the length D5. Moreover, the flange 15 may also provide the doughnut cylinder 16 in the outer surface thereof facing the front housing 22a. The radial width of the cylinder 16 may be also set such that the outer diameter of the doughnut cylinder 16 is substantially equal to or slightly less than the inner diameter of the bore 45. Inserting the protruding portion of the stub 12 with the doughnut cylinder 16 into the pocket 22b of the front housing 22a, the optical alignment of the pig-tail unit 3 in the plane perpendicular to the optical axis may be automatically carried out.

In an example, setting the outer diameter D1 of the doughnut cylinder 16 to be 2.499 mm with a tolerance of ±0.010 mm, the inner diameter D6 of the pocket 22b of the front housing 22a to be 2.519 mm with a tolerance of ±0.01 mm; two members may form a gap therebetween of 0.02 mm at the maximum and 0.00 mm at the minimum. Moreover, assuming the offset between the bore 22d of the rear housing 22e into which the first lens 9 is inserted and the diameter of the bore 45 in the front housing 22a is ±0.01 mm, the offset between the axis of the first lens 9 and the center of the stub 12 becomes 0.0475 mm at the maximum.

The bottom 31 to which the support 32 of the first lens 9 is fixed may be precisely processed so as to define the length from the fourth end 46 to which the pig-tail unit 3 is fixed. For instance, the bottom 31 may be processed by a tolerance within ±0.02 mm. Abutting the support 32 against the bottom 31 and fixing thereto, meanwhile, abutting the flange 15 against the fourth end 46, the optical alignment along the optical axis may be performed by a tolerance less than ±0.1 mm.

Figure 5A:
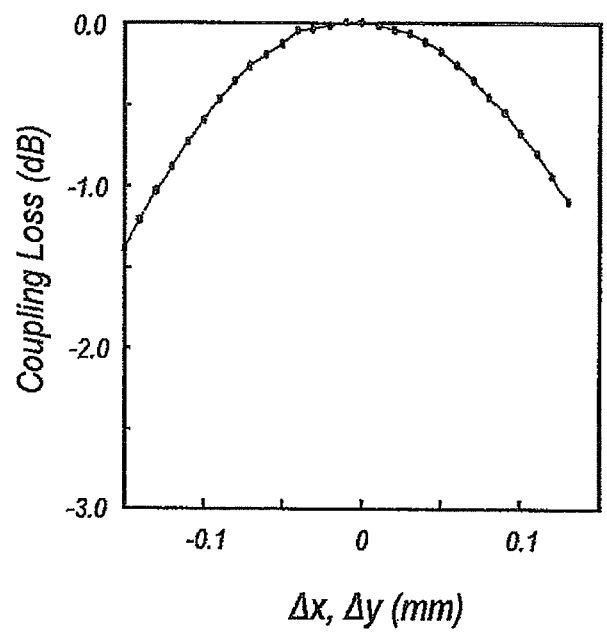
FIG. 5A shows the optical coupling loss between the coupling fiber and the TOSA against the deviation in the plane perpendicular to the optical axis of the coupling fiber (FIG. 5A) and the deviation along the optical axis thereof (FIG. 5B)
Figure 5B:
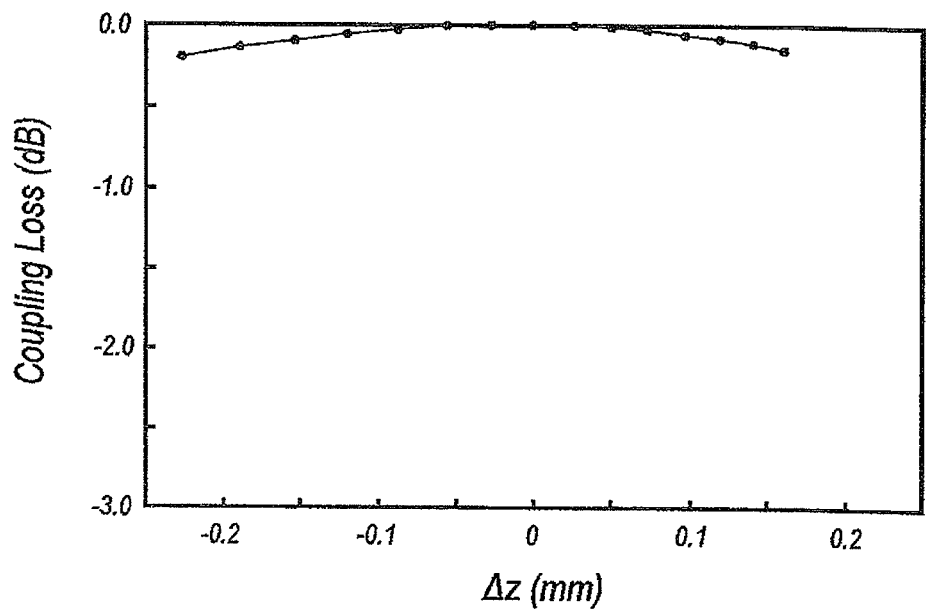

FIGS. 5A and 5B show the optical coupling characteristics between members against the positional tolerance in a plane perpendicular to the optical axis, that is, $\Delta x$ and $\Delta y$, and that along the optical axis $\Delta z$. Referring to FIG. 5A, the tolerance less than 0.0475 mm may show the optical coupling loss less than 0.5 dB between the first lens 9 and the coupling fiber 14. Moreover, the tolerance less than 0.1 mm may show the coupling loss less than 0.5 dB. Thus, the pig-tail unit 3, the SC unit 3A, or the LC unit 3B may be automatically aligned with the first lens 9 by the arrangement of the protruding stub 41a, 41b or 12, with the doughnut cylinder, 16 or 44, by the tolerance less than ±0.05 mm in the plane perpendicular to the optical axis and the tolerance less than ±0.1 mm along the optical axis.

The YAG laser welding may fix the SC connector 42a, the LC connector 42b, or the sleeve 13 to the fourth end 46 of the front housing 22a. The flange, 15, 43a, or 43b, preferably has the same diameter with each other. The YAG laser welding may be carried at several points along the periphery of the flange, 43a, 43b and 15. Then, the arrangement where the various flanges have the common diameter gives an advantage for the process of the YAG laser welding.

The stub, 41a, 41b and 12, have the length D5 protruding from the end surface of the flange, 43a, 43b, and 15, which makes the optical distance from the end of the stub, 41a, 41b, and 12, to the first lens 9 equal to each other. Thus, even when the unit of the SC connector, the LC connector, and the pig-tail is exchanged, the optical arrangement of the module does not change.

Figure 6:
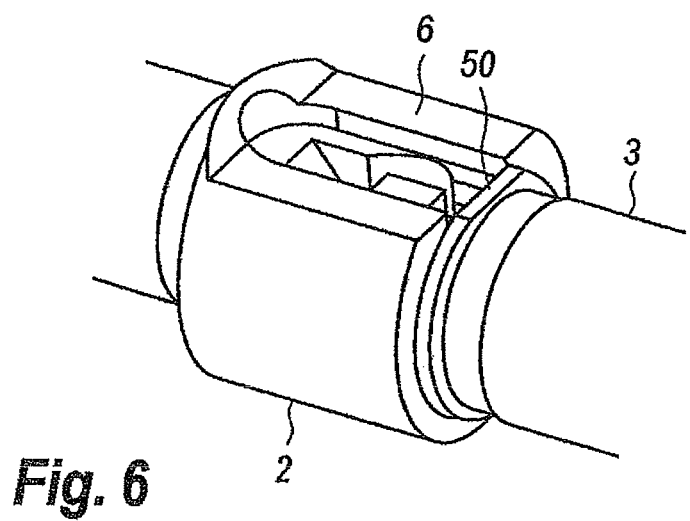
FIG. 6 illustrates an example of an indicator showing the inclined direction of the end of the stub.

The rotational angle of the units, 3A, 3B, and 3, around the optical axis, that is, the direction of the inclined surface of the end of the stub, 41a, 41b, and 12, may identified by cutting a portion of the flange, 43a, 43b, and 15. FIG. 6 schematically illustrates the cut 50 formed in the flange, 43a, 43b, and 15. The cut 50 is formed in a position of the flange, 43a, 43b, and 15, extending the inclined end surface of the stub, 41a, 41b, and 12. Aligning the cut 50 with the third end 6 to which the ROSA 21 is fixed, and welding the unit to the fourth surface 46; the rotational angle of the unit may be aligned in a predetermined position.

Next, a process to assemble the optical module will be described. First, assembling the first WDM filter 7, the second WDM filter 8, the first lens 9, the cut filter 10, and at least one of the pig-tail unit 3, the SC unit 3A, and the LC unit in the housing 2; an intermediate product is prepared. The first lens 9 by the support 32 thereof is fixed to the inner wall 30 and the bottom 31.

Then, the optical alignment along the optical axis of respective OSAs, 20a, 20b and 21, is carried out by using respective jointing members, 27a, 27b and 28. Subsequently, the process carries the optical alignment for respective OSAs, 20a, 20b and 21, in the plane perpendicular to the optical axis by sliding the jointing member, 27a, 27b and 28, on the respective ends, 4 to 6. In the optical alignment of the TOSAs, 20a and 20b, the LD, 23a and 23b, practically emits light and the light is detected through the fiber 11; while, the light provided from the fiber 11 is detected by the PD 25 in the ROSA 21.

When the first lens is aligned such that the beam waist is on the virtual plane extending from the first end 4, the first TOSA 20a is aligned such that the beam waist of the unit lens 26a is on this virtual plate. Similarly, when the first lens is aligned so as to set the beam waist thereof on the second end 5, the unit lens 26b in the second TOSA 20b is aligned so as to set the beam waist thereof on the second end 5. Thus, the TOSAs, 20a and 20b, may be aligned with respective ends, 4 and 5, not with respect to the end of the coupling fiber 14.

In the foregoing detailed description, the optical module according to the present invention have been described with reference to specific exemplary embodiments thereof. It will, however, be evident that various modifications and changes may be made thereto without departing from the broader spirit and scope of the present invention. For instance, the embodiment includes two TOSAs and one ROSA. The number of TOSAs, and that of the ROSA are not restricted to those arrangements. Accordingly, the present specification and figures are accordingly to be regarded as illustrative rather than restrictive.

REFERENCE SIGNS LIST 2 housing
3 fiber unit
4 first end
5 second end
6 third end
7 first wavelength division multiplexing filter
8 second WDM filter
9 first lens
10 wavelength cut filter
11 optical fiber
12 stub
13 sleeve
14 coupling fiber
15 flange
20a first TOSA
20b second TOSA
21 ROSA
22a front housing
22d bore
22e rear housing
46 fourth end

The invention claimed is:

1. An optical module comprising:
a fiber unit including a stub and a flange in an end portion of the fiber unit, the stub having a coupling fiber in a center portion thereof and a portion accompanied with the coupling fiber protruding from the flange;
a housing including a bore and a pocket, the housing installing a first lens in the bore, the pocket receiving the portion of the stub accompanied with the coupling fiber protruding from the flange, the flange being fixed to a surface of the housing; and
at least two transmitter optical sub-assemblies (TOSAs) each including a unit lens and an optically active semiconductor device, the TOSAs being optically coupled with the coupling fiber through the respective unit lens and the first lens by optically aligning the respective TOSAs with the housing,
wherein the stub has a diameter substantially equal of or slightly less than a diameter of the pocket of the housing to passively align the coupling fiber with the first lens in the housing,
wherein the first lens has beam waist on a virtual surface extending from respective ends of the housing where the TOSAs are attached thereto and another beam waist on an end of the coupling fiber secured in the stub, and
wherein the respective unit lenses installed in the TOSAs have beam waists on the respective virtual surfaces of the housing and other beam waists on respective surfaces of the optically active semiconductor devices.

2. The optical module of claim 1,
wherein the housing further includes another bore connected to the bore of the pocket, the other bore installing a wavelength division multiplexing (WDM) filter therein,
wherein the WDM filter transmits light coming from one of the TOSAs toward the first lens and reflects light coming from the other of the TOSAs toward the first lens.

3. The optical module of claim 2,
further comprising a receiver optical sub-assembly (ROSA) including a unit lens and an optically active semiconductor device and another WDM filter set in the bore of the housing and between the coupling fiber and the first lens,
the another WDM filter reflects light provided from the coupling fiber toward the ROSA but transmits the light coming from the first lens toward the coupling fiber.

4. The optical module of claim 1,
wherein the first lens in the bore of the housing is held by the housing through a support.

5. The optical module of claim 4,
wherein the support of the first lens has a diameter equal to or slightly less than a diameter of the bore to fix the support within the bore tightly.

6. The optical module of claim 1,
wherein the stub accompanied with the coupling fiber has an end surface inclined with a plane perpendicular to an optical axis of the coupling fiber by about six degree, and
wherein the flange is provided in the end portion of the fiber unit, the flange having an indexing cut aligned with a direction of the inclined end of the coupling fiber.

7. The optical module of claim 6,
wherein the first lens has an axis in parallel to but offset from an axis of the coupling fiber.

8. The optical module of claim 6,
wherein the first lens has an axis in parallel to but offset from an axis of the unit lens set in one of the TOSAs.

9. The optical module of claim 3,
wherein the unit lens provided in the ROSA has a beam waist on the end of the coupling fiber and another beam waist on a surface of the optically active semiconductor device installed in the ROSA.

10. An optical module, comprising:
a fiber unit including a stub and a flange in an end portion of the fiber unit, the stub having a coupling fiber in a center portion thereof and a portion accompanied with the coupling fiber protruding from the flange;
a housing including a bore and a pocket, the housing installing a first lens in the bore, the pocket receiving the portion of the stub protruding from the flange;
at least two transmitter optical sub-assemblies (TOSAs) each including a unit lens and an optically active semiconductor device, the TOSAs being optically coupled with the coupling fiber through the respective unit lenses and the first lens by optically aligning the respective TOSAs with the housing,
wherein the flange includes a doughnut cylinder in a surface facing the housing, the doughnut cylinder being received within the pocket and having an outer diameter substantially equal or slightly less than a diameter of the pocket to passively align the coupling fiber with the first lens in the housing,
wherein the first lens has beam waist on a virtual surface extending from ends of the housing where the respective TOSAs are attached thereto and another beam waist on an end of the coupling fiber secured in the stub, and
wherein the respective unit lenses installed in the TOSAs have beam waists on the respective virtual surfaces of the housing and other beam waists on respective surfaces of the optically active semiconductor devices.

* * * * *